United States Patent
Coulson

(10) Patent No.: US 6,914,853 B2
(45) Date of Patent: Jul. 5, 2005

(54) MECHANISM FOR EFFICIENT WEAROUT COUNTERS IN DESTRUCTIVE READOUT MEMORY

(75) Inventor: Richard L. Coulson, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/712,432

(22) Filed: Nov. 12, 2003

(65) Prior Publication Data

US 2004/0095840 A1 May 20, 2004

Related U.S. Application Data

(63) Continuation of application No. 09/966,499, filed on Sep. 27, 2001, now abandoned.

(51) Int. Cl.[7] ................................................. G11C 8/00
(52) U.S. Cl. .................. 365/236; 365/145; 365/185.11; 365/185.24; 711/103
(58) Field of Search ................................ 365/236, 145, 365/185.11, 185.24; 711/103

(56) References Cited

U.S. PATENT DOCUMENTS

| 5,222,109 A | 6/1993 | Pricer |
| 5,485,595 A | 1/1996 | Assar et al. |
| 5,530,828 A | 6/1996 | Kaki et al. |
| 5,963,970 A | 10/1999 | Davis |
| 6,000,006 A | 12/1999 | Bruce et al. |
| 6,055,180 A | 4/2000 | Gudesen et al. |
| 2003/0046493 A1 * | 3/2003 | Coulson ................ 711/118 |

* cited by examiner

*Primary Examiner*—Richard Elms
*Assistant Examiner*—Toan Le
(74) *Attorney, Agent, or Firm*—Marger Johnson & McCollom, P.C.

(57) ABSTRACT

A memory device having a wear out counter. The memory device includes at least one block of memory, that block having a metadata section associated with it. A number of bits in the metadata section are used to store the current state of a wear out counter. As the block is accessed, the counter is incremented, allowing a memory controller to level usage and to rectify any problems associated with wear out of that block. A method for incrementing the counter is also included.

28 Claims, 4 Drawing Sheets

MECHANISM FOR EFFICIENT WEAROUT COUNTERS IN DESTRUCTIVE READOUT MEMORY

This application is a continuation of prior U.S. Ser. No. 09/966,499 filed Sep. 27, 2001, now abandoned.

BACKGROUND

1. Field of the Invention

This disclosure relates to destructive readout memories, more particularly to mechanisms to track and level usage in these memories.

2. Background of the Invention

Polymer ferroelectric memories generally comprise a polymer material having ferroelectric properties arranged adjacent to some type of control structures. The control structures may be as simple as metal electrode lines. The control structures manipulate the ferroelectric state of the polymer material. In memory applications, the ferroelectric state having one characteristic is determined to be a data 'one,' and a different characteristic is determined to be a data 'zero.'

These memories are relatively inexpensive on a cost/bit basis, and reasonable simple to manufacture. However, the ferroelectric properties of the polymer material degrade after extensive use. It would be helpful to track access of the memory array to manage usage and wear out of blocks within the array.

It would also be useful to perform the tracking with minimal impact on processing efficiency, as well as requiring a minimal amount of storage.

BRIEF DESCRIPTION OF THE DRAWINGS

The invention may be best understood by reading the disclosure with reference to the drawings, wherein.

DETAILED DESCRIPTION OF THE EMBODIMENTS

Memory devices, such as disks or disk caches, are typically laid out in blocks of 512 bytes. Each block of data has metadata associated with it, which may include an error correction code (ECC) that allows checking and correction of errors in that data block. Typically, the ECC is a preexisting data set, even if the memory has never been accessed, even if the pre-existing data is all zeros. If the memory block is being used as cache memory, there will often be flags and other information may also reside in the metadata section allowing the system to make cache policy decisions. This data may include usage information for replacement of data, etc. This section may also include a wear out counter that tracks the usage history of the block of memory.

Figure 1:
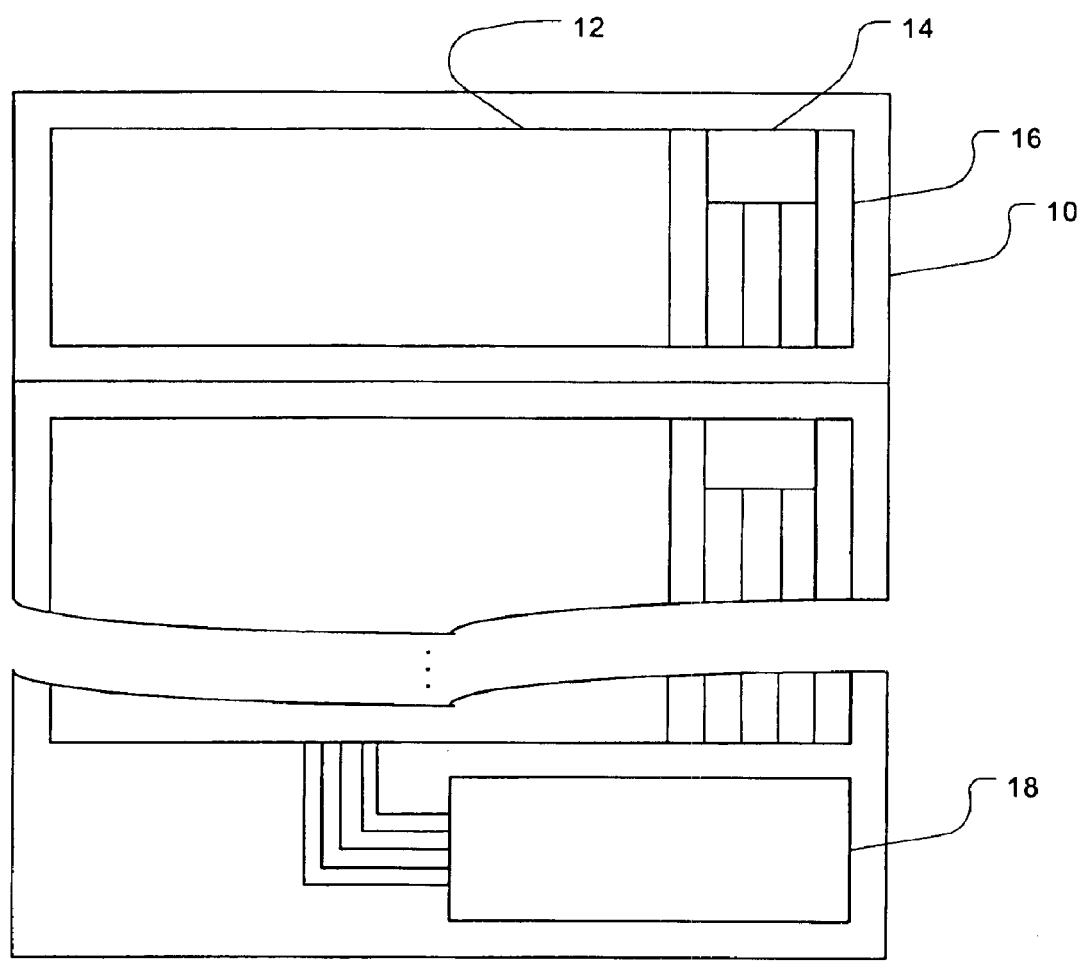
FIG. 1 shows a block diagram of one embodiment of a memory block on a ferroelectric memory chip.

In FIG. 1, a memory chip 10 has at least one block of memory that resides upon it. Each block of memory has a sector of memory cells 12 and a metadata section 14. The metadata section may include the ECC, flags for cache operations, etc., as well as a wear-out counter 16. The wear out counter 16 will more than likely include just the data storage for the wear out counter, as the logic that actually reads and increments, decrements or resets the counter will usually lie in the memory controller 18. Techniques for minimizing the amount of storage required for the memory controller will be discussed further with reference to FIG. 5.

The memory controller may not be a separately dedicated controller, but the system processor or another system controller that also handles memory control. However, for purposes of this discussion, this will be referred to as a memory controller, even though it may have many other functions. Similarly, while the memory controller is shown as residing adjacent the blocks of memory in the embodiment of FIG. 1, the memory controller 18 may reside separately from the memory, such as on a host or system board. Alternatively, it may even comprise software control on a processor.

In one embodiment the memory blocks and memory chip are comprised of polymer ferroelectric memory. This type of memory, like other types of memory cells that have a finite lifetime can also degrade over time or 'wear out.' The counter used to track the number of times a particular block has been accessed is referred to here as a 'wear out counter.' A wear out counter may be used for any block or other division of a memory that can degrade over time and/or with extensive use, such as repeated access.

Figure 2:
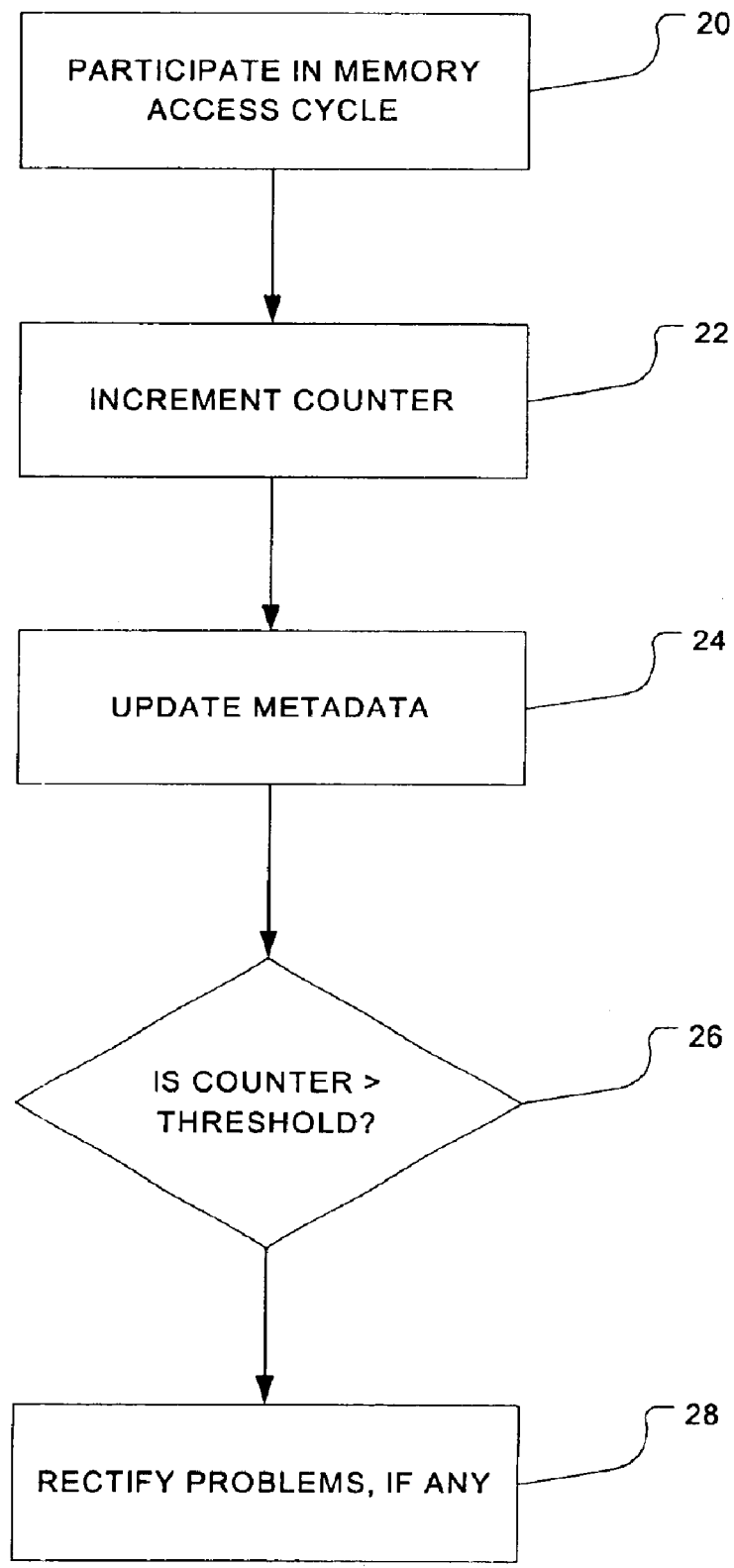
FIG. 2 shows a flowchart of one embodiment of a memory access cycle, in accordance with the invention.

A flowchart of one embodiment of a method for tracking memory access using a wear out counter is shown in FIG. 2. The block of memory participates in a memory access cycle at 20. The memory access cycle may be a read cycle or a write cycle as will be discussed with reference to FIGS. 3 and 4. The counter is incremented to reflect the new access cycle at 22. After the counter is updated the error correction code, if used, is updated at 24 to reflect the changes to the memory data caused by the memory access cycle and to the metadata caused by the incremented counter.

At 26, the counter is checked against a predetermined threshold of a number of access cycles. The predetermined threshold is a number set depending upon the characteristics of the memory. A memory block that has participated in a memory access cycle more times than that set by the threshold may be in risk of wearing out or failing. At this point the memory controller or software will "remap" this sector of memory and transfer its contents to a new memory location that has not exceeded its wearout threshold. If the counter has not exceeded the threshold at 26, the memory block can continue to participate in memory access cycles with no rectification.

Figure 3:
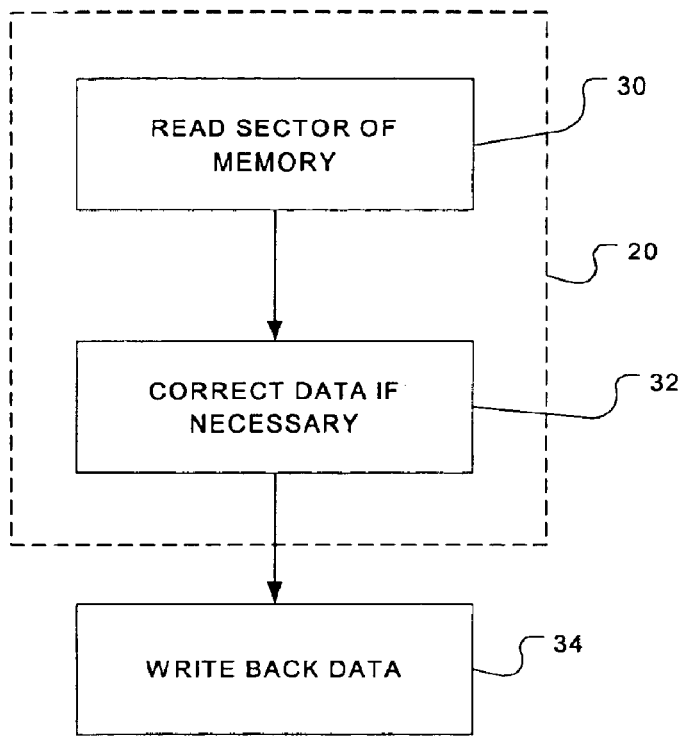
FIG. 3 shows a flowchart of one embodiment of a read cycle, in accordance with the invention.

In one embodiment, the memory access cycle may be a read cycle. This is shown in more detail in FIG. 3. The memory access cycle of 20 in FIG. 2 is shown in FIG. 3 as one embodiment of a read cycle in FIG. 3. At 30, a sector of memory is read. The sector may be a block, more than one block, or part of a block. At 32, the block data is corrected using the appropriate ECC for the data. If ECC is used to correct the data, the sector of memory will be an entire block, as ECC can only be used on an entire block. Correction of the block data with the ECC is optional, as some memories may be 'good' enough to not require use of ECC.

In this example, the sector will be a block of data, as shown in FIG. 1. Typically, this block is 512 Kbytes, but no limitation on the size of the blocks is intended by this example. For that block, the ECC located in the metadata section is used to correct the data, as discussed above. No correction may be necessary, but the correction is performed as needed.

As mentioned previously, the memory block may comprise at least a portion of a polymer ferroelectric memory array. Polymer ferroelectric memories generally comprise a layer of polymer material having ferroelectric properties sandwiched between two layers of electrode lines, where the electrode lines may be arranged as word and bit lines. Polymer ferroelectric memories do not require any transistors for each cell, relying instead upon alterations of the ferroelectric state of a local area of the polymer material to store ones and zeros. One state is determined to be a one, and the opposite polarization state of the region of the polymer between two particular electrodes is determined to be a zero.

These memories have several advantages over conventional memory products available currently. With the lack of transistors, they are relatively simple to manufacture and therefore can be manufactured inexpensively and with higher yields, as there are no circuit components for each cell that may fail. However, when the cells of this type of memory array are accessed for a read, they undergo a 'destructive' read. Generally, the process of sensing the polarization state of the cell returns the polarization state of the cell to that state associated with a zero. Therefore, during a read cycle such as that shown in FIG. 3, the data must be written back to the memory cells after the read. It must be noted that the example of polymer ferroelectric memories is given only one type of destructive read memories. Application of the invention is not limited to polymer ferroelectric memories, but may be used in any memory having a destructive read cycle. This includes the embodiments discussed with regard to FIG. 3.

In the example of FIG. 3, the data is written back at 34. In the context of the process shown in FIG. 2, this would occur after the ECC and other metadata are updated to reflect the incrementing of the counter at 34. As destructive read memories already require a write back of the metadata, updating the counter does not contribute to any significant increase in overhead, making the process of using a wear out counter transparent with regard to the performance of the memory.

Figure 4:
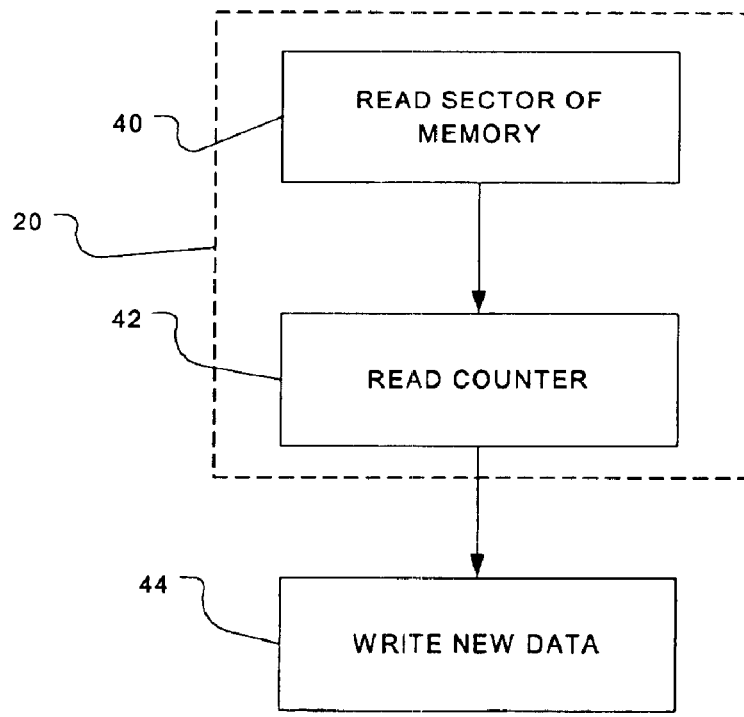
FIG. 4 shows a flowchart of one embodiment of a write cycle, in accordance with the invention.

In a write process, an example of which is shown in FIG. 4, the approach is similar. However, in order to write to a destructive read memory, such as the polymer ferroelectric memory, it is generally desirable to first 'zero out' the memory, bringing all of the cells to a known polarization state. The destructive nature of read cycles in these memories allows this to be accomplished by performing a read and then discarding the data.

In FIG. 4, the memory access cycle 20 of FIG. 2 comprises reading the sector of memory at 40, as well as reading the counter at 42. Again, since the reading process has to be performed anyway, there is no significant contribution to any overhead for the wear out counter.

Referring back to FIG. 2, after the memory access cycle 20 is accomplished, the counter is incremented. After the ECC, if used, and other metadata are updated at 24, the write of new data shown at 44 in FIG. 4, would occur. The write back of the data would include the updated ECC, if used, and the incremented counter value.

As discussed above, the incrementing and writing of the counter does not contribute to any significant overhead with regard to the time and processing overhead of the memory. It is also helpful if the counter does not take up much space in the metadata section of the memory block as well.

However, the number of accesses after which the memory block may degrade is on the order of $10^{12}$. This is referred to as the usage threshold. In order to count that many cycles, the counter would require 40 bits. If the memory chip has 1 Gigabyte of data on it, that would be 2 million blocks, each requiring 40 bits of a wear out counter, or 80 Megabits of data just for the counters.

Figure 5:
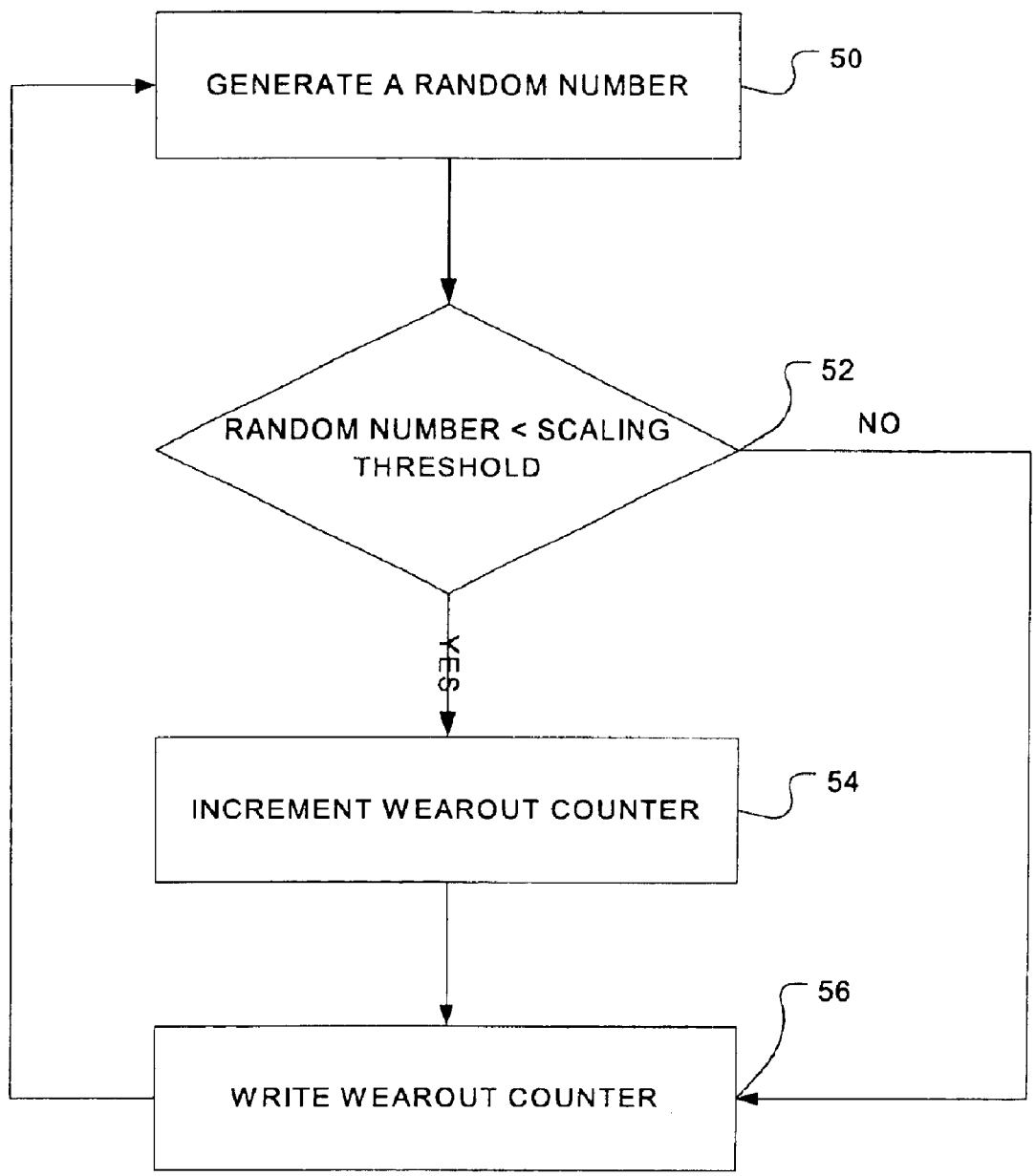
FIG. 5 shows a flowchart of one embodiment of a method to provide a wear out counter using a minimal number of bits, in accordance with the invention.

FIG. 5 shows one embodiment of a method to increment a counter using minimal space while still providing a reasonably accurate indication of wear out. Note that incrementing the counter, as used here, may include decrementing a counter, such as a countdown counter, as well. The process is based upon a scaling threshold that is determined by the number of bits the system designer desires to use for the wear out counter and the usage threshold. The number of bits will also depend upon the desired accuracy. For example, assume the designer wants to determine when a block has been accessed $10^{12}$ times, the usage threshold, but has some leeway in accuracy. The wear out counter can indicate wear out in the range of $5 \times 10^{11}$ to $5 \times 10^{12}$.

As an example, assume the usage threshold is $10^{12}$ and the system designer desires a wear out counter using only 4 bits. A 4-bit counter can count up to 16. Therefore, the scaling threshold is the highest number counted by the number of bits divided by the usage level being tracked, in this case $16/10^{12}$, or $1.6 \times 10^{-11}$. This scaling threshold is used as will be discussed with reference to FIG. 5.

In FIG. 5, a random number is generated at 50. Random, as used here, may include a true random number from a random number generator, a pseudo-random number, a number determined by algorithm, etc. A processor somewhere in the system will probably perform this task, whether it is the memory controller, a central processing unit or other processor in the system is left up to the system designer. The random number (between 0 and 1) is generated as part of the process of incrementing the counter, as shown in FIG. 2. The random number is then compared to the scaling threshold. In the example discussed above, the scaling threshold is $1.6 \times 10^{-11}$.

If the random number has a predetermined relationship with the scaling threshold, the wear out counter is incremented at 52. Typically this predetermined relationship will be if the random number is less than the scaling threshold. If the random number is not greater than the scaling threshold, the current value of the wear out counter is written back during one of the memory access cycles as discussed in FIGS. 3 and 4. Note that this process is referred to as incrementing the wear out counter, even if the wear out counter is not actually incremented. In either case, the wear out counter is written back at 56. In this manner, the counter will be incremented on average every $10^{12}/16$ times. In one view of this process, when the counter is incremented, it is as if the first threshold is multiplied by the second threshold to determine what the actual threshold is. When the counter indicates that it has reached 16, the number of accesses for that block is approximately $10^{12}$, or whatever usage threshold is determined. The usage threshold may also be referred to as a criterion to determine if the counter needs to be incremented.

Several different factors can affect this process, depending upon the specific application. The counter cannot be too small for a particular application, or probability of it prematurely indicating wear out becomes too high. The number of bits allocated for the random number generation must be appropriate for the threshold being used. Other types of techniques can be used to increment the counter, other than that shown in FIG. 5.

Referring back to FIG. 2, this is just one possible implementation for incrementing the counter at 22. An alternative embodiment involves one counter that counts up to the number of bits/usage threshold, such as $16/10^{12}$. When it hits that number, it just increments the counter for whichever particular block is currently being accessed. This may in some cases average out across the device and provide a fairly accurate assessment of when the blocks are reaching their usage threshold. Alternative embodiments could include the use of bell curves, probability theory and other statistical predictive methods.

However, tracking the individual block usage has other advantages. Unlike the example above where the wear out counter for a block is incremented in a statistical fashion, rather than for a particular block, tracking the individual blocks allows usage to be leveled across the device. For example, for some reason a particular set of blocks or even an individual block may be accessed more frequently than others. Tracking actual individual usage allows the system to determine which blocks have not been used very much and direct memory traffic to them to level out the usage across the device. The nature and details of these types of processes are beyond the scope of this disclosure, but may be enabled by the use of a wear out counter as discussed above.

The actual implementation of a counter and the tracking may be simple enough to be implemented in hardware using counters and registers within a controller or other logic device. Alternatively, it may be implemented in processor firmware, where only the data for the wear out counter is actually stored in hardware, being stored in the metadata section of the memory block. These choices are left up to the system designer.

Thus, although there has been described to this point a particular embodiment for a method and apparatus for a memory having wear out counters to track usage, it is not intended that such specific references be considered as limitations upon the scope of this invention except in-so-far as set forth in the following claims.

What is claimed is:

1. A memory device having a destructive read process, comprising:
   at least one sector of memory cells within a block of memory;
   a metadata block within each of the blocks of memory associated with the sector of memory cells within that block of memory;
   a counter within each metadata block, wherein the counter is operable to track usage of the sector of memory cells associated with the metadata block.

2. The memory device of claim 1, wherein the memory device further comprises a polymer ferroelectric memory device.

3. The memory device of claim 1, wherein the memory device is used as a disk replacement.

4. The memory device of claim 1, wherein the memory device is used as a non-volatile cache memory.

5. The memory device of claim 1, wherein the metadata block further comprises flags set and reset during cache operations.

6. A method of tracking usage of a destructive read memory device, the method comprising:
   participating an a memory access cycle;
   incrementing a counter producing an incremented counter, wherein the counter is contained in metadata for a block participating in the memory access cycle;
   updating a preexisting error correction code producing an updated error correction code, wherein the error correction code includes new data from the memory access cycle and the incremented counter; and
   determining if the counter exceeds a predetermined threshold.

7. The method of claim 6, wherein the memory access cycle further comprises:
   reading a sector of memory; and
   correcting data from the sector of memory as necessary using the preexisting error correction code producing corrected data.

8. The method of claim 7, wherein the method further comprises writing the corrected data, the incremented counter and the updated error correction code to the memory block.

9. The method of claim 6, wherein the memory access cycle further comprises erasing a sector and reading the counter.

10. The method of claim 9, wherein the method further comprises writing new data, the incremented counter, and the updated error correction code to the memory sector previously erased.

11. The method of claim 6, wherein incrementing a wear out counter further comprises:
    generating a random number;
    comparing the random number to a scaling threshold;
    incrementing the wear out counter, if the random number is less than the scaling threshold;
    writing the wear out counter to a metadata block of a memory.

12. The method of claim 6, wherein incrementing a wear out counter further comprises:
    incrementing a second counter for each memory access cycle;
    determining if the second counter has reached a value substantially equal to a number of bits for the wear out counter divided by a usage threshold; and
    incrementing the wear out counter if the second counter has reached the value.

13. A method of updating a counter, the method comprising:
    generating a random number;
    comparing the random number to a scaling threshold, wherein the scaling threshold is substantially equal to a number of bits for a counter divided by a usage threshold;
    incrementing the counter, if the random number has a predetermined relationship to the scaling threshold;
    writing the incremented counter to a metadata block of a memory.

14. The method of claim 13, wherein the number of bits for a counter is four.

15. The method of claim 13, wherein the predetermined relationship further comprises the random number being less than the scaling threshold.

16. A method comprising:
    comparing a random number to a first predetermined threshold according to a criterion;
    if the random number meets the criterion, incrementing a counter, comparing the incremented counter to a second predetermined threshold; and
    if the incremented counter exceeds the second predetermined threshold, taking an action as though the incremented counter exceeds the second predetermined counter multiplied by the first predetermined threshold.

17. The method of claim 16 further comprising storing the incremented counter.

18. The method of claim 16, wherein the counter is used in a destructive read memory.

19. The method of claim 16, wherein the counter is used in a polymer ferroelectric memory.

20. A memory device, comprising:
- at least one block of memory cells;
- a metadata block associated with each of the blocks of memory cell;
- a counter located on the memory device associated with each metadata block, wherein the counter is operable to track usage of the block of memory cells associated with the metadata block.

21. The memory device of claim 20, wherein the memory device further comprises a polymer memory device.

22. The memory of claim 20, wherein the memory device further comprises a ferroelectric memory device.

23. The memory device of claim 20, wherein the memory device is used as a disk replacement.

24. The memory device of claim 20, wherein the memory device is used as a non-volatile cache memory.

25. The memory device of claim 20, wherein the metadata block further comprises flags set and reset during cache operations.

26. A method of tracking usage of a memory device, the method comprising:
- participating an a memory access cycle;
- incrementing a counter producing an incremented counter, wherein the counter is associated with a metadata block for a block participating in the memory access cycle;
- updating a preexisting error correction code producing an updated error correction code, wherein the error correction code includes new data from the memory access cycle and the incremented counter; and
- determining if the counter exceeds a predetermined threshold.

27. The method of claim 26, wherein incrementing a counter further comprises incrementing a hardware counter implemented in logic on the memory device.

28. The method of claim 26, the method comprising tracking usage of a polymer memory device.

* * * * *